United States Patent [19]

Zhao et al.

[11] Patent Number: 5,744,411
[45] Date of Patent: Apr. 28, 1998

[54] ALUMINUM NITRIDE SINTERED BODY WITH HIGH THERMAL CONDUCTIVITY AND ITS PREPARATION

[75] Inventors: JunHong Zhao; Theresa A. Guiton; Yi-Hung Chiao; William Rafaniello, all of Midland, Mich.; Noboru Hashimoto, Suita, Japan; Kyoji Tanaka, Kouriyama, Japan; Susumu Kajita, Hirakata, Japan; Hiroyoshi Yoden, Kadoma, Japan

[73] Assignee: The Dow Chemical Company, Midland, Mich.

[21] Appl. No.: 557,025

[22] PCT Filed: Apr. 18, 1994

[86] PCT No.: PCT/US94/04256

§ 371 Date: Dec. 7, 1995

§ 102(e) Date: Dec. 7, 1995

[87] PCT Pub. No.: WO95/02563

PCT Pub. Date: Jan. 26, 1995

[51] Int. Cl.$^6$ ..................... C04B 35/581; C04B 35/582
[52] U.S. Cl. ..................... 501/98.5; 501/98.6; 501/98.4; 501/152; 428/698; 428/704; 428/901; 427/383.3; 264/61; 264/65

[58] Field of Search .................. 501/96, 98, 153, 501/152, 98.5, 98.4, 98.6; 264/65, 61; 428/698, 704, 901; 427/383.3, 383.5

[56] References Cited

U.S. PATENT DOCUMENTS

| | | | |
|---|---|---|---|
| 4,711,861 | 12/1987 | Sawamura et al. | 501/96 |
| 4,877,760 | 10/1989 | Okuno et al. | 501/98 |
| 5,242,872 | 9/1993 | Taniguchi et al. | 501/98 |
| 5,314,850 | 5/1994 | Miyahara | 501/98 |
| 5,330,692 | 7/1994 | Hashimoto et al. | 501/98 |
| 5,424,261 | 6/1995 | Harris et al. | 501/96 |

*Primary Examiner*—Michael Marcheschi

[57] ABSTRACT

An aluminum nitride sintered product with a high thermal conductivity (at least 100 W/m.K) can be prepared at a sintering temperature of less than 1850° C. (often less than 1650° C.) using a sinterable combination of aluminum nitride powder with at least three sintering aids. The sintering aids include a source of a rare earth metal oxide, a source of an alkaline earth metal oxide, a boron source and, optionally, a source of aluminum oxide. The sinterable combinations may also be used to prepare cofired, multilayer substrates.

18 Claims, No Drawings

ALUMINUM NITRIDE SINTERED BODY WITH HIGH THERMAL CONDUCTIVITY AND ITS PREPARATION

This application is made under 35 United States Code section 371 of international application number PCT/US94/04256, filed Apr. 18, 1994.

BACKGROUND OF THE INVENTION

The invention relates to a sintered body of aluminum nitride (AlN) with high thermal conductivity and a process for preparing the sintered body at a relatively low sintering temperature. The invention relates more particularly to ternary sintering aid combinations that enable preparation of the sintered body at temperatures of 1850° Centigrade (°C.) or less, preferably 1650° C. or less. The sintered body is suitable for use in a variety of known applications including integrated circuit substrates, integrated circuit heat sinks and packaging components or multichip module components. The sintered body may also be used in structural applications such as crucibles and components of armor.

AlN is an excellent material having a high thermal conductivity, insulation resistance and a low thermal expansion coefficient among its desirable properties. However, since AlN is a covalent bonding compound, it is quite difficult to produce a pure AlN sintered product without using sintering aids or a hot-press sintering method.

Sintered AlN bodies are typically prepared by heating an admixture of AlN powder and one or more sintering aids to a temperature within a range of from 1500° C. to as high as 2100° C. in an atmosphere that promotes sintering. The sintering aids typically include one or more oxides of alkaline earth metals or oxides of rare earth metals. Kasori et al. (U.S. Pat. No. 4,746,637) use a sintering aid combination of yttrium oxide ($Y_2O_3$) and calcium oxide (CaO) to sinter AlN powder at a temperature of 1650° C. or above. Other sintering aids may be used in place of, or in addition to, the alkaline earth metal oxides and rare earth metal oxides. Okuno et al. (U.S. Pat. No. 4,877,760) use at least one boride, carbide or nitride of titanium, zirconium, hafnium, vanadium, niobium or tantalum or boride or carbide of chromium, molybdenum or tungsten and, optionally, other sintering additives such as alkaline earth metal oxides and rare earth metal oxides. The sintering aids, including optional sintering aids, should not exceed 5 parts by weight per 100 parts by weight of AlN.

JP H03-146471 discloses mixtures of at least one oxide of yttrium, scandium or a lanthanide and at least one of lanthanum hexaboride ($LaB_6$), magnesium hexaboride and calcium hexaboride as sintering aids. JP H03-197366 discloses mixtures of calcium oxide and $LaB_6$ as sintering aids. These combinations of sintering aids lead to AlN sintered products that show a high thermal conductivity, but prefer a sintering temperature of 1900° C. or above. Such temperatures make it necessary to use an expensive high temperature sintering furnace and fittings, such as a setter, capable of use at those temperatures. In addition, such temperatures result in high energy costs.

JP H04-130064 discloses sintering aids that are mixtures of a boron based compound such as boron nitride, boron carbide, boron oxide or boron fluoride, at least one oxide, carbide, nitride, or boride of titanium, chromium, manganese, iron, cobalt, nickel, copper, zinc, zirconium, molybdenum, cadmium, tin or tungsten and at least one alkaline earth metal oxide or rare earth metal oxide.

SUMMARY OF THE INVENTION

A first aspect of the invention is a process for producing an aluminum nitride (AlN) sintered product with a high thermal conductivity at a relatively low sintering temperature. For this aspect, an AlN powder having a specific surface area in a range of about 3 to 8 $m^2/g$, and preferably 4.5 to 7.5 $m^2/g$, and an oxygen content between 0.5 and 1.8 wt %, is used. Optimum amounts of sintering aids are combined with the AlN powder. The sintering aids substantially constitute a combination of three sintering aids (I), (II) and (III). Sintering aid (I) is at least one selected from the group consisting of rare earth oxides and rare earth compounds. The rare earth compounds are converted to corresponding rare earth oxides during sintering. Sintering aid (I) is incorporated such that an equivalent rare earth oxide amount thereof is in a range of 0.5 to 10 wt %, based on weight of the AlN sintered product. Sintering aid (II) is at least one selected from the group consisting of alkaline earth oxides and alkaline earth compounds. The alkaline earth compounds are converted to corresponding alkaline earth oxides during sintering. Sintering aid (II) is incorporated such that an equivalent rare earth oxide amount thereof is in a range of 0.1 to 5 wt %, based on weight of the AlN sintered product. Sintering aid (III) is at least one selected from the group consisting of $LaB_6$, NbC, and WB. An additive amount of $LaB_6$ is in a range of 0.05 to 3 wt %, based on weight of the AlN sintered product. A resulting mixture is compacted to a desired shape, and then sintered in a nonoxidative atmosphere at a sintering temperature of 1650° C. or below to provide a sintered product with a high thermal conductivity of 120 W/m.K or more.

A second aspect of the invention is a sinterable aluminum nitride powder composition comprising aluminum nitride powder and a sintering aid combination that consists essentially of a rare earth metal oxide source, an alkaline earth metal oxide source, a boron source selected from the group consisting of aluminum boride, aluminum diboride, calcium boride, yttrium boride, strontium boride, barium boride, cerium boride, praseodymium boride, samarium boride and neodymium boride, and, optionally, a source of aluminum oxide.

A third aspect of the invention is a sintered aluminum nitride body having a high thermal conductivity and comprising, based upon body weight, from about 90 to about 99.5 weight percent aluminum nitride as a primary phase, from about 0.5 to about 10 weight percent of a secondary phase selected from the group consisting of alkaline earth metal aluminates, rare earth metal aluminates, alkaline earth metal-rare earth metal aluminates, complex alkaline earth metal-rare earth metal oxides and mixtures thereof, and boron at a level of from about 50 to about 5000, preferably from about 50 to about 2000 parts by weight per million parts of body weight, as determined by secondary ion mass spectrometry (SIMS). The alkaline earth metal is preferably calcium and the rare earth metal is preferably yttrium.

A fourth aspect of the invention is a process for preparing a sintered aluminum nitride body having a high thermal conductivity that comprises heating the sinterable composition of the second aspect to a temperature of from about 1570° C. to about 1850° C., preferably from about 1570° C. to about 1650° C. in a nonoxidizing atmosphere for a period of time sufficient to attain a density of at least 95 percent of theoretical density.

In an aspect related to the third and fourth aspects, the sintered aluminum nitride body can be a cofired, multilayer aluminum nitride substrate fabricated by a method comprising:

a. preparing at least two ceramic green sheets from the sinterable composition of second aspect;

b. depositing a desired pattern of a refractory metal ink on at least one major planar surface of at least one ceramic green sheet;

c. preparing a laminate of a desired number of ceramic green sheets having refractory metal ink deposited thereon;

d. heating the laminate under the conditions of the fourth aspect to effect sintering of both the ceramic sheets and the refractory metal ink deposited on said sheets.

DESCRIPTION OF PREFERRED EMBODIMENTS

In the field of powder metallurgy, it has been already known that as an average particle size of a powder used for obtaining its sintered product decreases, the sintering temperature can generally be lowered. For example, an AlN powder having a specific surface area within a range of from 10 to 14 $m^2/g$ is densely sintered at a temperature of 1600° C. or below. However, as the AlN powder becomes increasingly fine, that is, the specific surface thereof increases, oxygen content of the powder also increases. When such an AlN powder having a high oxygen content is sintered, the sintered product has a low thermal conductivity. For example, when AlN powder made by a conventional carbothermal reduction method has a specific surface area of more than 10 $m^2/g$, it also has an oxygen content of more than 1.8 wt %. Therefore, an AlN powder with a low oxygen content should be used for producing the AlN product of the first aspect. The AlN powder should also have an optimum surface area in order to be sintered at sintering temperatures of about 1650° C. or below, and preferably less than 1625° C. These temperatures are advantageous because a relatively inexpensive ceramic, such as aluminum oxide, can be used for fittings, such as a setter, that are placed in a furnace during sintering. A more expensive ceramic for such fittings is hexagonal boron nitride. The relatively low temperatures, compared to temperatures of 1800° C. or more, lead to energy savings.

With regard to the first aspect of the invention, it is preferred that the AlN powder have an oxygen content between 0.5 and 1.8 wt % and a specific surface area in a range of 3 to 8 $m^2/g$, more preferably 4.5 to 7.5 $m^2/g$, is used for enhancing low temperature sintering thereof and improving thermal conductivity of a resulting AlN sintered product. When the oxygen content is more than 1.8 wt %, it becomes difficult to produce an AlN sintered product with a high thermal conductivity by sintering at a temperature of about 1650° C. or below. On the other hand, it is difficult and expensive to produce an AlN powder having an oxygen content less than 0.5 wt %. When the specific surface area of the AlN powder is less than 3 $m^2/g$, the powder is not densified sufficiently at a sintering temperature of about 1650° C. or below. An average particle size of an AlN powder suitable for use in this aspect of the invention is in a range of 0.20 micrometer (μm) to 0.46 μm. It is also preferred that the AlN powder be made by a carbothermal reduction method because AlN powder made by direct nitridation has an unstable aluminum oxide surface layer, so that it is possible to increase the oxygen content of the AlN powder during a process for producing the AlN sintered product.

Sinterable compositions of the second aspect of the invention are prepared by adding a sintering aid combination to aluminum nitride powder. A sinterable composition is heated to a temperature of from 1570° C. to about 1850° C., preferably from about 1570° C. to about 1650° C. in a nonoxidizing atmosphere for a period of time sufficient to yield a sintered aluminum nitride body having a density of at least 95 percent of theoretical density. The resulting sintered body contains boron at a level of from about 50 to about 5000, preferably from about 50 to about 2000 parts by weight per million parts of body weight, as determined by SIMS.

AlN powder suitable for purposes of the invention may be of commercial or technical grade. It should not contain any impurities that would have a significant adverse effect upon desired properties of a resulting sintered product. Although some level of impurities is present in commercial powders, that level should be less than that which produces the aforementioned adverse effect.

The AlN powder typically has a bound oxygen content of less than 4 wt %. The oxygen content is desirably less than 3 wt % and preferably less than 2 wt %.

The AlN powder also typically has a surface area, measured by a conventional adsorption method such as that taught by S. Brunauer, P. H. Emmett and E. Teller in *Journal of the American Chemical Society*, volume 60, page 309 (1938) (hereinafter "BET"), of from 1.5 to 10 square meters per gram ($m^2/g$). The powder surface area is desirably from 2 to 9 $m^2/g$.

AlN powder meeting these specifications are preferably prepared either by carbothermal reduction of alumina ($Al_2O_3$) or direct nitridation of aluminum metal. AlN powders may also be prepared by other processes using aluminum alkyls or aluminum halides. Preferred carbothermal AlN powders are available from "THE DOW CHEMICAL COMPANY" under the trade designation "XUS 35544" and "XUS 35548" or "TOKUYAMA SODA" under the trade designations "GRADE F" and "GRADE H". Mixtures of these and other powders may also be used.

The sintering aid combination includes at least one alkaline earth metal oxide source, at least one rare earth metal oxide source, at least one boron source. The sintering aid combination may also include, as an optional component, at least one source of aluminum oxide ($Al_2O_3$). The alkaline earth metal oxide sources and rare earth metal oxide sources include the oxides as well as acetates, carbonates, nitrates, hydrides, phosphates, hydroxides, aluminates, formates, oxalates and sulfates. The sources of $Al_2O_3$ include $Al_2O_3$ itself as well as aluminum acetate, aluminum hydroxide, aluminum butoxide, aluminum ethoxide, aluminum propoxide, aluminum oxalate, aluminum nitrate, aluminum phosphate and aluminum sulfate.

Sintering aid (I) is at least one of rare earth metal oxides and rare earth metal sources or compounds. The rare earth metal sources are converted to their corresponding rare earth metal oxides, rare earth metal aluminates or both during sintering. The rare earth metal oxides include yttrium oxide ($Y_2O_3$), and oxides of elements 57 through 71 of the *Periodic Table of the Elements*. The oxides of said elements are lanthanum ($La_2O_3$), cerium ($Ce_2O_3$), praseodymium ($Pr_2O_3$), neodymium ($Nd_2O_3$), promethium ($Pm_2O_3$), samarium ($Sm_2O_3$), europium ($Eu_2O_3$), gadolinium ($Gd_2O_3$), terbium ($Tb_2O_3$), dysprosium ($Dy_2O_3$), holmium ($Ho_2O_3$), erbium ($Er_2O_3$), thulium ($Tm_2O_3$), ytterbium ($Yb_2O_3$), and lutetium ($Lu_2O_3$). The rare earth metal oxide is desirably $Y_2O_3$, $La_2O_3$, $Ce_2O_2$, $Ce_2O_3$, $Dy_2O_3$ or $Sm_2O_3$, preferably $La_2O_3$ or $Y_2O_3$. The rare earth metal oxide source is desirably present in an amount sufficient to provide an equivalent rare earth metal oxide content within a range of from 0.25 to 10 wt % (0.5 to 10 wt % for the first aspect and 0.25 to 5 wt % for all other aspects of the invention), based upon sinterable composition weight. The range is preferably from about 0.7 to about 4, more preferably from about 1 to about 3 wt %, based upon sinterable composition weight.

Sintering aid (II) is at least one of alkaline earth metal oxides and alkaline earth metal sources or compounds. The alkaline earth metal sources are converted to their corresponding alkaline earth metal oxides, alkaline earth metal aluminates or both during sintering. The alkaline earth metal oxides are magnesium oxide (MgO), calcium oxide (CaO), barium oxide (BaO) and strontium oxide (SrO). Although radium is also an alkaline earth metal, its radioactivity removes it from consideration as a suitable source of a sintering aid. The alkaline earth metal oxide is preferably CaO. Calcium carbonate ($CaCO_3$) is a preferred source of CaO as it is more stable than CaO. The alkaline earth metal oxide source is desirably present in an amount sufficient to provide an equivalent alkaline earth metal oxide content within a range of from about 0.2 to 5 wt %, based upon sinterable composition weight. The range is quite satisfactory when sintering is conducted in a graphite furnace. The greater amount should be at least 0.5 wt %, based upon sinterable composition weight. The range is preferably from about 0.25 to about 3, more preferably from about 0.5 to about 2 wt %, based upon sinterable composition weight. If sintering is conducted in a refractory metal furnace, such as a tungsten furnace, a greater amount of alkaline earth metal oxide, especially calcium oxide, is required.

Sintering aid (III), a source of boron, is suitably: tungsten boride (WB); a compound represented as $MB_2$ where M is a metal selected from magnesium (Mg), aluminum (Al), scandium (Sc), yttrium (Y), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), ruthenium (Ru), osmium (Os), uranium (U) and plutonium (Pu); a compound represented as $M_2B_5$ where M is a metal selected from Mo and W; a compound represented as $MB_4$ where M is a metal selected from Ca, Y, Mo and W; $MB_6$ where M is a metal selected from Ca, Y, strontium (Sr), barium (Ba), Y and Lanthanides; a compound represented as $MB_{12}$ where M is a metal selected from Al, Sc, Y, Zr, an Actinide or a Lanthanide; a compound represented as $MB_{66}$ where M is Y; or a boron rich metal oxide such as calcium borate or aluminum borate. Other boron sources should also provide satisfactory results. Sintering aid (III) is capable of enhancing low temperature sintering of AlN powder and improving thermal conductivity of resulting AlN sintered products. For the first aspect of the invention only, sintering aid (III) may be niobium carbide (NbC). The source of boron is desirably aluminum boride ($AlB_{12}$), aluminum diboride ($AlB_2$), calcium boride ($CaB_6$), yttrium boride ($YB_6$), lanthanum hexaboride ($LaB_6$), strontium boride ($SrB_6$), barium hexaboride ($BaB_6$), cerium tetraboride ($CeB_4$), cerium hexaboride ($CeB_6$), praseodymium boride ($PrB_6$), samarium boride ($SmB_6$), WB or neodymium boride ($NdB_6$). The source of boron is preferably $AlB_{12}$, $AlB_2$, WB, $LaB_6$ or $CaB_6$. The source of boron for all aspects of the invention other than the first aspect is desirably present in an amount sufficient to provide an equivalent boron content within a range of from 0.01 to 1 wt %, based upon sinterable composition weight. The range is preferably from 0.02 to 0.5, more preferably from 0.04 to 0.3 wt %, based upon sinterable composition weight.

For the first aspect of the invention, an optimum amount of $LaB_6$ is in a range of 0.05 to 3 wt %, based on sintered product weight. As the amount of $LaB_6$ is increased within the range, the thermal conductivity of the AlN sintered product is remarkably improved. However, an amount of $LaB_6$ in excess of 3 wt % inhibits sintering. Also with respect to the first aspect of the invention, an optimum amount of NbC or WB is in a range of 0.05 to 5 wt %, based on sintered product weight. As with $LaB_6$, increasing amounts within the range improve thermal conductivity of the AlN sintered product. However, an amount of NbC or WB in excess of 5 wt % inhibits sintering. In addition, the amount of sintering aid (III) used in the first aspect closely relates to the specific surface area and oxygen content of the AlN powder. If the AlN powder has a relatively small specific surface area and a low oxygen content, it is expected that a small amount of sintering aid (III) within the range will be sufficient to convert the AlN powder into a sintered product with a high thermal conductivity. On the other hand, using an AlN powder with a relatively large specific surface area and a high oxygen content requires a large amount of sintering aid (III) within the range in order to improve thermal conductivity of the sintered product. For the first aspect of the invention, sintering aid (III) should have a purity of 99.9% or more, and an average particle size of less than 10 μm for uniformly incorporating the aid into AlN powder.

Aluminum oxide ($Al_2O_3$) may be added as a fourth component of the sintering aid combination. Preferred sources of $Al_2O_3$ include $Al_2O_3$ itself and aluminum hydroxide. When added, the source is desirably present in an amount sufficient to provide an equivalent $Al_2O_3$ content within a range of from greater than zero wt % to 2 wt %, based upon sinterable composition weight. The range is preferably from greater than zero wt % to 1 wt %, more preferably from greater than zero wt % to 0.5 wt %, based upon sinterable composition weight.

The sintering aid combination is suitably admixed with AlN powder in an amount of from 0.05 wt % to 10 wt %, based upon sinterable composition weight. The amount is desirably from 0.5 wt % to 5 wt %, preferably from 0.5 to 3 wt %, based upon sinterable composition weight. Each component of the sintering aid combination suitably has a surface area similar to that of the AlN powder.

An admixture of AlN powder and the sintering aid(s) may be prepared by conventional procedures such as attrition milling and wet and dry ball milling. Wet ball milling with an appropriate solvent and suitable milling media provides satisfactory results. Milling media, usually in the form of cylinders or balls, should have no significant adverse effect upon admixture components or upon sintered bodies prepared from the admixture. A solvent such as ethanol, heptane or another organic liquid may be used. A suitable solvent is a blend of ethanol and chlorothene. After milling, the organic liquid may be removed by conventional procedures to yield an admixture suitable for conversion to ceramic greenware. Oven drying and spray drying produce satisfactory results.

An organic binder may be added during milling of the admixture. Suitable binders are well known in the art and typically comprise high molecular weight organic materials that are soluble in organic solvents. Illustrative binders include polyethyloxazoline, industrial waxes such as paraffin, highly viscous polyglycols, polymethylmethacrylate and polyvinyl butyral. A blend of polyethyloxazoline in an amount of from 20 to 80, preferably from 35 to 65, wt % and polyethylene glycol in an amount of from 80 to 20, preferably from 65 to 35, wt %, based upon blend weight wherein the amounts total 100 percent, is particularly suitable. The binder is suitably added to admixture components prior to milling.

Any well known dispersing aid or dispersant may also be added during milling of the admixture. Fish oil is a particularly suitable dispersant.

Ceramic greenware may be prepared by any one of several conventional procedures such as extrusion, injection molding, die pressing, isostatic pressing, slip casting, roll compaction or forming or tape casting to produce a desired shape. Particularly satisfactory results are obtained by dry pressing an admixture (preferably spray dried) or tape casting a slurry.

The ceramic greenware is desirably subjected to conditions sufficient to remove the organic binder prior to sintering. Binder removal, also known as binder burn out, typically occurs by heating the greenware to a temperature that ranges from 50° C. to 1000° C. to pyrolyze, or thermally decompose, the binder. A suitable time and temperature combination for removing the blend polyethyloxazoline and polyethylene glycol is from 1 to 7 hours at a temperature of from 400° to 800° Centigrade (°C.), with four hours at a temperature of 575° C. being particularly suitable. The temperature and hold time vary depending upon the binder, and dimensions of the greenware. Thermal decomposition may be carried out at or near ambient pressure or in a vacuum. It may be carried out in the presence of atmospheric air or in a neutral atmosphere. The neutral atmosphere is desirably established with at least one gas selected from nitrogen and a noble gases such as argon. The gas is preferably nitrogen. As a general rule, binder burn out in the presence of an inert gas such as nitrogen yields a higher residual carbon level than binder burn out in the presence of atmospheric air. Binder burnout in the presence of nitrogen is preferred for purposes of the present invention.

Conventional procedures may be used to prepare a cofired multilayer aluminum nitride substrate. The procedures include using greenware in the form of sheets, depositing a conventional refractory metal ink or paste on at least one major planar surface of at least one greenware sheet, forming a laminate of a desired number of ceramic green sheets having refractory metal ink deposited thereon, and sintering the laminate to effect sintering of both the ceramic sheets and the refractory metal ink deposited on said sheets. Prior to sintering, the laminate may be subjected to a binder burnout step. A suitable refractory metal ink is a tungsten ink ("CRYSTALEKO, #2003 ink").

Sintering of the greenware, after binder burnout, occurs in a nonoxidizing atmosphere established by gaseous nitrogen or a source of gaseous nitrogen and is followed by cooling in a vacuum or in a neutral atmosphere like that used for thermal debindering. The source of gaseous nitrogen may be gaseous nitrogen, gaseous ammonia, gaseous mixtures of nitrogen and ammonia, gaseous mixtures of nitrogen, ammonia or both with an inert or noble gas such as argon, or gaseous mixtures of nitrogen, ammonia or both with hydrogen and, optionally, an inert or noble gas. A favorable sintering atmosphere may be established by placing the greenware into a crucible fabricated from a refractory material, such as boron nitride, aluminum nitride, molybdenum metal or tungsten metal, prior to sintering and cooling. The greenware may also be placed on a setter within the crucible. The setter is preferably fabricated from the same material as the crucible. The refractory material will vary depending upon which type of furnace is used for sintering. Boron nitride and aluminum nitride are preferred refractory materials for a graphite furnace, whereas molybdenum metal or tungsten metal is preferred for a tungsten furnace.

Sintering desirably occurs at a temperature of from about 1570° to about 1850° C. (1650° C. or below for the first aspect of the invention). In accordance with the first aspect, when using intermediate surface area (4.5to 7.5 m$^2$/g) AlN powders and LaB$_6$ as sintering aid (III), the temperature is preferably in a range of 1570° C. to 1640° C., more preferably 1570° C. to 1625° C. For all aspects of the invention and any other sintering aid (III), including WB or NbC suitable for use in the first aspect of the invention, the temperature is preferably from about 1570° to about 1650° C., more preferably from about 1600° to about 1650° C. The sintering temperature is maintained for a period of time sufficient to attain a density of at least 95, preferably at least 97, percent of theoretical density. The period of time is desirably from 0.5 hour to 24 hours, preferably from 2 to 10 hours, and more preferably 6 hours. If the sintering time is less than 0.5 hour, the density will be less than 95 percent of theoretical density unless the sintering temperature is raised to 1700° C. or higher. Although this may be done, it disregards any economic or physical property advantage resulting from sintering at lower temperatures.

During sintering, sintering aids (I), (II) and (III) react with a surface layer of aluminum oxide on the AlN powder to generate a complex oxide with a relatively low melting point. The complex oxide is presumably capable of removing oxygen atoms from grain boundaries of the sintered AlN bodies. The removal of oxygen atoms improves thermal conductivity of the sintered AlN bodies.

Sintered AlN bodies of the invention have a thermal conductivity in excess of 100 watts per meter-Kelvin (W/m.K). The thermal conductivity is desirably greater than 120 W/m.K, preferably greater than 140 W/m.K and more preferably greater than 150 W/m K. A theoretical maximum thermal conductivity for single crystal AlN is 319 W/m.K. An upper limit for thermal conductivity is therefore 319 W/m.K. An acceptable upper thermal conductivity limit for many practical applications is 230 W/m.K.

Sintered AlN bodies of the invention also have a density of at least 95 percent of theoretical density display color/translucency combinations that range from light cream and translucent to dark gray or even black and opaque. Skilled artisans can attain a desired combination of color and thermal conductivity without undue experimentation.

Sintered AlN bodies of the invention comprise, based upon body weight, from 90 to 99.5 weight percent aluminum nitride as a primary phase; from 0.5 to 10 weight percent of a secondary phase, and boron at a level of from 50 to 5000, preferably from 50 to 2000 parts by weight per million parts of body weight, as determined by secondary ion mass spectrometry. The boron is present as a boron derivative that is a secondary phase or is dispersed throughout the secondary phase(s), or is dispersed on an atomic level within aluminum nitride's crystal lattice or a combination thereof. The secondary phase is at least one material selected from yttrium aluminates, calcium-yttrium aluminates, complex calcium-yttrium oxides and mixtures thereof. The secondary phase may also include an amount of calcium aluminate. Specific examples of secondary phase materials include $Al_2Y_4O_9$, $AlYO_3$, $Al_5Y_3O_{12}$, $CaYAlO_4$, $CaY_2O_4$ and mixtures thereof.

The following examples are solely for purposes of illustration and are not to be construed, by implication or otherwise, as limiting the scope of the present invention.

EXAMPLE 1

Ball mill an AlN powder (1.25 wt % oxygen, specific surface area of 5.0 m$^2$/g), sintering aids and isopropyl alcohol as a solvent to prepare a mixed powder. The sintering aids are $Y_2O_3$ as (I), $CaCO_3$ as (II) and $LaB_6$ as (III). The amounts of $Y_2O_3$, $CaCO_3$ and $LaB_6$ are 2.0 wt %, 0.89 wt % and 0.1 wt %, respectively. An equivalent CaO amount of $CaCO_3$ is 0.5 wt %. The mixed powder is compacted under a pressure of 1.5 ton/cm$^2$ (1361 kilogram (kg)/cm$^2$) with a rubber press to a disc having a diameter of 20 mm and a height of 10 mm. The disc is set in a boron nitride setter and sintered for 4 hours at a temperature of 1600° C. in a non-oxidizing atmosphere including nitrogen gas to obtain a sintered product.

EXAMPLES 2–25

Repeat Example 1, but use AlN powders, sintering temperatures and sintering aid amounts as shown in Table I to obtain sintered products. Each sintered product is ground and polished to provide an AlN sintered disc having a diameter of 10 mm and a thickness of 3 mm. Each disc is then measured for relative density (% of theoretical density) and thermal conductivity (laser flash method). Results of the measurements are also shown in Table I.

The results in Table I show that a combination of $Y_2O_3$, CaO and $LaB_6$ provides acceptable AlN sintered bodies at temperatures as low as 1570° C. with AlN powders having a variety of oxygen contents and specific surface areas. Acceptable bodies have a relative density of at least 90% and a thermal conductivity of at least 100 W/m.K. The results also show that while a given sinterable composition may provide unacceptable results in terms of relative density, thermal conductivity or both at a particular temperature, a small increase in temperature produces acceptable results. Examples 17* and 18 as well as 21* and 22 illustrate this point.

EXAMPLES 26–35

Repeat Example 1, but change at least one of the AlN powder, the sintering temperature and the sintering aids as shown in Table II. Table II also shows thermal conductivity measurements for resulting sintered bodies. All sintered bodies have a relative density of greater than 98% except example 37 which has a relative density of 94.0.

TABLE I

| Example No. | AlN Properties | | Sinter Temp. (°C.) | Sintering Aids (wt %) | | | Density (% Theoretical) | Thermal Conductivity (W/m · K) |
|---|---|---|---|---|---|---|---|---|
| | Specific Surface Area (m$^2$/g) | Oxygen Content (wt %) | | $Y_2O_3$ | $CaCO_3$ (CaO)** | $LaB_6$ | | |
| 1 | 5.0 | 1.25 | 1600 | | 0.89 (0.5) | 0.1 | 99.5 | 135 |
| 2 | 5.0 | 1.25 | 1600 | 2.0 | 0.89 (0.5) | 0.2 | 99.0 | 137 |
| 3 | 5.0 | 1.25 | 1600 | 2.0 | 0.89 (0.5) | 0.3 | 99.0 | 140 |
| 4 | 5.0 | 1.25 | 1600 | 2.0 | 0.89 (0.5) | 0.4 | 98.5 | 145 |
| 5 | 5.0 | 1.25 | 1620 | 2.0 | 0.89 (0.5) | 0.5 | 98.3 | 160 |
| 6 | 6.5 | 1.40 | 1580 | 2.0 | 0.71 (0.4) | 0.6 | 98.3 | 130 |
| 7 | 8.0 | 1.75 | 1570 | 3.0 | 0.89 (0.5) | 0.5 | 98.5 | 120 |
| 8 | 5.5 | 1.32 | 1600 | 5.0 | 1.79 (1.0) | 0.8 | 98.0 | 135 |
| 9 | 7.5 | 1.60 | 1600 | 7.0 | 1.79 (1.0) | 1.0 | 99.1 | 130 |
| 10 | 4.6 | 1.15 | 1600 | 3.0 | 3.57 (2.0) | 0.5 | 98.0 | 140 |
| 11 | 6.0 | 1.3 | 1620 | 3.0# | 0.89 (0.5) | 2.0 | 99.5 | 140 |
| 12 | 3.5 | 1.0 | 1600 | 2.0 | 1.79 (1.0) | 1.0 | 93.5 | 106 |
| 13 | 3.5 | 1.0 | 1650 | 2.0 | 1.79 (1.0) | 1.0 | 98.0 | 125 |
| 14 | 3.6 | 1.0 | 1600 | 1.4 | 2.5 (1.4) | 0.5 | 92.0 | 100 |
| 15 | 3.6 | 1.0 | 1650 | 1.4 | 2.5 (1.4) | 0.5 | 98.0 | 127 |
| 16 | 3.6 | 1.0 | 1700 | 1.4 | 2.5 (1.4) | 0.5 | 98.5 | 140 |
| 17* | 4.5 | 1.10 | 1570 | 2.0 | 0.89 (0.5) | 0.5 | 89.0 | 100 |
| 18 | 4.5 | 1.10 | 1600 | 2.0 | 0.89 (0.5) | 0.5 | 98.5 | 145 |
| 19 | 4.5 | 1.10 | 1650 | 2.0 | 0.89 (0.5) | 0.5 | 99.5 | 150 |
| 20 | 4.5 | 1.10 | 1700 | 2.0 | 0.89 (0.5) | 0.5 | 99.5 | 155 |
| 21* | 7.5 | 1.60 | 1550 | 2.0 | 0.89 (0.5) | 0.5 | 86.0 | 75 |
| 22 | 7.5 | 1.60 | 1570 | 2.0 | 0.89 (0.5) | 0.5 | 99.5 | 120 |
| 23 | 7.5 | 1.60 | 1600 | 2.0 | 0.89 (0.5) | 0.5 | 99.5 | 135 |
| 24 | 7.5 | 1.60 | 1650 | 2.0 | 0.89 (0.5) | 0.5 | 99.5 | 140 |
| 25 | 7.5 | 1.60 | 1700 | 2.0 | 0.89 (0.5) | 0.5 | 99.5 | 145 |

*means not an example of the invention
**Equivalent CaO amount of $CaCO_3$
# means 2 wt % $Y_2O_3$ and 1 wt % of $La_2O_3$

TABLE II

| Example No. | AlN Properites Specific Surface Area (m²/g) | Oxygen Content (wt %) | Sinter Temp. (°C.) | Sintering Aids (wt %) | | | | Thermal Conductivity (W/m · K) |
|---|---|---|---|---|---|---|---|---|
| | | | | $Y_2O_3$ | $CaCO_3$ (CaO)** | NbC | WB | |
| 26 | 5.3 | 1.29 | 1600 | 2.0 | 1.79 (1.0) | 0.5 | 0.0 | 137 |
| 27 | 4.0 | 1.00 | 1625 | 2.0 | 1.79 (1.0) | 0.1 | 0.0 | 140 |
| 28 | 7.5 | 1.60 | 1580 | 3.0 | 0.89 (0.5) | 3.5 | 0.0 | 121 |
| 29 | 6.0 | 1.35 | 1600 | 2.0 | 0.89 (0.5) | 0.5 | 0.0 | 133 |
| 30 | 4.5 | 1.10 | 1600 | 1.0 | 0.89 (0.5) | 0.5 | 0.0 | 147 |
| 31 | 9.0 | 2.10 | 1600 | 2.0 | 1.79 (1.0) | 3.5 | 0.0 | 111 |
| 32 | 5.3 | 1.29 | 1600 | 2.0 | 1.79 (1.0) | 0.0 | 0.5 | 135 |
| 33 | 4.0 | 1.00 | 1640 | 2.0 | 1.79 (1.0) | 0.0 | 0.1 | 142 |
| 34 | 7.5 | 1.60 | 1580 | 3.0 | 0.89 (0.5) | 0.0 | 3.5 | 120 |
| 35 | 6.0 | 1.35 | 1600 | 2.0 | 0.89 (0.5) | 0.0 | 0.5 | 130 |
| 36 | 4.5 | 1.10 | 1600 | 1.0 | 0.89 (0.5) | 0.0 | 0.5 | 141 |
| 37 | 3.3 | 0.80 | 1625 | 2.0 | 1.79 (1.0) | 0.0 | 0.5 | 104 |
| 38 | 9.0 | 2.10 | 1600 | 2.0 | 1.79 (1.0) | 0.0 | 3.5 | 109 |

**Equivalent CaO amount of $CaCO_3$

The data in Table II show that NbC and WB are acceptable substitutes for $LAB_6$.

EXAMPLE 39

Ball mill 100 grams (g) AlN powder ("THE DOW CHEMICAL COMPANY" as "XUS 35544", oxygen content of 1.1±0.1 wt %, carbon content of less than 0.08 wt %, both percentages being based on powder weight, and a surface area of 3.2±0.2 m²/g), 2 g $Y_2O_3$ powder ("UNOCAL MOLYCORP" 99.99% purity), 0.9 g $CaCO_3$ powder ("FISHER SCIENTIFIC"), 0.25 g $AlB_2$ ("ALDRICH CHEMICAL CO. INC.") and 3.1 g of a binder composition in 60.5 g of a solvent blend. The binder composition is a 35/65 weight ratio blend of polyethyloxazoline and polyethylene glycol 3350 ("THE DOW CHEMICAL COMPANY"). The solvent blend is a 50/50 (by volume) blend of ethanol and chlorothene. The binder is dissolved in the solvent blend before the AlN, $Y_2O_3$, $AlB_2$ and $CaCO_3$ powders are added. Ball milling continues for a period of 4 hours to provide a milled slip. Solids contained in the milled slip are separated from most of the solvent blend using a rotary evaporator. Remaining solvent blend removal occurs via drying under vacuum at a temperature of 60° C. for a period of 15 hours. After drying is complete, the solids are crushed and screened through a 60 mesh (250 μm sieve opening) sieve to provide a dried powder.

The dried powder is dry pressed into greenware using a ⅞ inch (2.2 cm) round die under uniaxial pressure of 15,000 pounds per square inch (psi) (about 103 megapascals (MPa)). The binder composition is removed from the greenware in the presence of flowing nitrogen ($N_2BBO$). Binder removal employs a heating rate of 90° C./hour up to 575° C., a four hour hold at that temperature and a cooling rate of 3° C./min down to room temperature (25° C.).

After binder removal is complete, the greenware is enclosed in a boron nitride setter that is placed in a boron nitride crucible to establish a neutral environment. The crucible is placed in a graphite furnace (one cubic foot (0.028 cubic meter) capacity, "THERMAL TECHNOLOGY MODEL" 121212G). The crucible and its contents are heated, in the presence of nitrogen flowing at a rate of 2 standard cubic feet per hour (scfh) (about 0.057 standard cubic meters per hour (scmh)) using a heating schedule that starts with heating to a temperature of 1200° C. at a rate of 25° C./min, held at 1200° C. for 30 minutes to ensure conversion of $CaCO_3$ to CaO), heated to 1625° C. at a rate of 10° C./min, held at 1625° C. for 6 hours and then cooled at a rate of 25° C./min down to 1000° C. The crucible contents, now sintered parts, are opaque, gray in color, with a smooth surface finish. The sintered parts have a density of 3.20 g/cm³ (greater than 97% of theoretical density) and a thermal conductivity (laser flash method) of 157 W/m.K. X-ray diffraction (XRD) analysis of the sintered parts reveals yttrium aluminate ($Al_2Y_4O_9$) and calcium-yttrium aluminate ($CaYAlO_4$) as secondary phases. Boron $K_\alpha$X-ray mapping using a microprobe shows a generally uniform distribution of boron containing phases. Analytical transmission electron microscopy (ATEM) shows that these phases are boron nitride.

Repeating this example, but without the $AlB_2$, leads to a lower density, a lower thermal conductivity, and a Secondary phase chemistry that is predominantly $Al_2Y_4O_9$.

EXAMPLES 40–56

Repeat Example 39 using the formulations shown in Table III. The CaO amounts are equivalents resulting from higher amounts of $CaCO_3$. For example, about 0.9 wt % $CaCO_3$ results in 0.5 wt % CaO.

TABLE III

| Example No. | $Y_2O_3$ (g) | CaO (g) | $AlB_2$ (g) | Density (g/cm³) | Density (% Theoretical) | Thermal Conductivity (W/m · K) |
|---|---|---|---|---|---|---|
| 40* | 2.475 | 0.275 | 0 | 2.750 | 83.3 | 127 |
| 41* | 2 | 0.5 | 0 | 2.834 | 86.1 | 133 |
| 42* | 1.375 | 1.375 | 0 | 3.025 | 92.1 | 133 |
| 43* | 0.55 | 2.2 | 0 | 2.953 | 90.4 | 122 |
| 44* | 0.275 | 2.475 | 0 | 2.922 | 89.6 | 115 |
| 45 | 2.25 | 0.25 | 0.25 | 3.159 | 95.9 | 151 |
| 46 | 2 | 0.5 | 0.05 | 3.189 | 96.8 | 148 |
| 47 | 2 | 0.5 | 0.25 | 3.205 | 97.4 | 152 |
| 48 | 1.75 | 0.75 | 0.25 | 3.159 | 96.1 | 150 |
| 49 | 1.25 | 1.25 | 0.25 | 3.112 | 94.9 | 140 |
| 50 | 0.5 | 2 | 0.25 | 3.004 | 92.0 | 126 |
| 51 | 1.375 | 0.275 | 1.1 | 3.081 | 94.1 | 138 |
| 52 | 0.825 | 0.825 | 1.1 | 3.120 | 95.4 | 141 |

TABLE III-continued

| Example No. | $Y_2O_3$ (g) | CaO (g) | $AlB_2$ (g) | Density (g/cm³) | Density (% Theoretical) | Thermal Conductivity (W/m · K) |
| --- | --- | --- | --- | --- | --- | --- |
| 53 | 0.275 | 1.375 | 1.1 | 3.003 | 92.2 | 124 |
| 54 | 0.275 | 0.275 | 2.2 | 3.060 | 94.2 | 114 |
| 55 | 1.875 | 0.625 | 0.25 | 3.204 | 97.3 | 148 |
| 56* | 1.875 | 0.625 | 0 | 2.829 | 86.0 | — |

*means not an example of the invention
— means not measured

The data in Table III, especially Example 55 and 56* and 41*, 46 and 47, demonstrate that a ternary sintering aid composition ($Y_2O_3$, CaO and $AlB_2$) leads to a combination of density and thermal conductivity that exceeds the combination attainable with similar amounts of a binary sintering aid composition ($Y_2O_3$ and CaO). The data also demonstrate that a low rare earth metal oxide content, as in Examples 53 and 54, leads to a lower thermal conductivity than a greater rare earth metal oxide content as in Example 51.

EXAMPLES 57–73

Repeat Examples 40–56 at a sintering temperature of 1650° C. using a tungsten furnace and enclosing the greenware in molybdenum-tungsten setters rather than boron nitride setters. Data similar to that of Table III are shown in Table IV.

TABLE IV

| Example No. | $Y_2O_3$ (g) | CaO (g) | $AlB_2$ (g) | Density (g/cm³) | Density (% Theoretical) | Thermal Conductivity (W/m · K) |
| --- | --- | --- | --- | --- | --- | --- |
| 57* | 2.475 | 0.275 | 0 | 2.886 | 87.4 | 113 |
| 58* | 2 | 0.5 | 0 | 2.974 | 90.3 | 122 |
| 59* | 1.375 | 1.375 | 0 | 3.074 | 93.6 | 119 |
| 60* | 0.55 | 2.2 | 0 | 2.866 | 87.7 | 106 |
| 61* | 0.275 | 2.475 | 0 | 2.840 | 87.0 | 98 |
| 62* | 2.25 | 0.25 | 0.25 | 2.714 | 82.3 | 122 |
| 63 | 2 | 0.5 | 0.05 | 3.139 | 95.3 | 142 |
| 64 | 2 | 0.5 | 0.25 | 3.190 | 96.9 | 149 |
| 65 | 1.75 | 0.75 | 0.24 | 3.181 | 96.8 | 149 |
| 66 | 1.25 | 1.25 | 0.25 | 3.135 | 95.6 | 138 |
| 67 | 0.5 | 2 | 0.25 | 3.019 | 92.4 | 122 |
| 68* | 1.375 | 0.275 | 1.1 | 2.665 | 81.4 | 117 |
| 69 | 0.825 | 0.825 | 1.1 | 3.127 | 95.8 | 148 |
| 70 | 0.275 | 1.375 | 1.1 | 3.006 | 92.3 | 121 |
| 71* | 0.275 | 0.275 | 2.2 | 2.466 | 75.9 | 80 |
| 72 | 1.875 | 0.625 | 0.25 | 3.190 | 96.9 | 152 |
| 73* | 1.875 | 0.625 | 0 | 2.466 | 86.8 | 115 |

*means not an example of the invention

The data in Table IV, especially Example 72 in comparison with Example 73* and Example 58* in comparison with Examples 63 and 64, verify the observation made following Table III in that the ternary sintering aid composition including a boron source provides better results than a binary sintering aid composition lacking a boron source. A comparison of Examples 45, 62*, 63, 68* and 71* shows that a metal refractory furnace may require an added amount of alkaline earth metal oxide in order to obtain performance equivalent to a graphite furnace using a boron nitride crucible. Example 71 shows that, at the constant total sintering aid level used in these examples, an excessive amount of $AlB_2$ relative to other components of the sintering aid composition leads to unacceptably low levels of density and thermal conductivity.

EXAMPLES 74–76

Repeat Example 55, but change the AlN powder and vary the temperature as shown in Table V. Examples 74–76 therefore contain 1.875 wt % $Y_2O_3$, 0.625 wt % CaO and 0.25 wt % $AlB_2$. The AlN powder has a surface area of 3.8 m²/g, an oxygen content of 1.35 wt % and a carbon content of 0.09 wt % (experimental powder designated 6419R, "THE DOW CHEMCIAL COMPANY"). The density and thermal conductivity data are shown in Table V.

TABLE V

| Example No. | Temperature (°C.) | Density (g/cm³) | Density (% Theoretical) | Thermal Conductivity (W/m · K) |
| --- | --- | --- | --- | --- |
| 74 | 1625 | 3.203 | 97.3 | 135 |
| 75 | 1600 | 3.205 | 97.4 | 128 |
| 76 | 1575 | 3.149 | 95.7 | 119 |

EXAMPLES 77–78

Repeat Example 72, but vary the temperature as shown in Table VI and use the AlN powder of Examples 74–76. The density and thermal conductivity data are shown in Table VI.

TABLE VI

| Example No. | Temperature (°C.) | Density (g/cm³) | Density (% Theoretical) | Thermal Conductivity (W/m · K) |
| --- | --- | --- | --- | --- |
| 77 | 1650 | 3.215 | 97.7 | 136 |
| 78 | 1625 | 3.194 | 97.0 | 132 |

The data in Tables V and VI show that an increase in AlN surface area improves sinterability as determined by maintaining acceptable density at lower temperatures than those used in Examples 55 and 72. The data also show that an increase in oxygen content over that used in Examples 55 and 72 causes a minor decrease in thermal conductivity, but may also contribute to enhanced densification.

EXAMPLES 79–95

Repeat Example 39, but use a different lot of the AlN powder used in Example 39, change the furnace to the tungsten used in Examples 57–73, increase the sintering temperature to 1650° C. and, for some examples, add an amount of $Al_2O_3$. The AlN powder has a surface area of 3.43 m²/g, an oxygen content of 1.16 wt % and a carbon content of 0.07 wt %. The component amounts, density and thermal conductivity data are shown in Table VII.

TABLE VII

| Example No. | $Y_2O_3$ (g) | CaO (g) | $AlB_2$ (g) | $Al_2O_3$ (g) | Density (g/cm³) | Density (% Theoretical) | Thermal Conductivity (W/m · K) |
| --- | --- | --- | --- | --- | --- | --- | --- |
| 79 | 1.875 | 0.625 | 0.150 | 0 | 3.180 | 96.6 | 155 |
| 80 | 2.344 | 0.781 | 0.188 | 0 | 3.183 | 96.5 | 150 |
| 81 | 2.813 | 0.938 | 0.225 | 0 | 3.166 | 95.7 | 146 |
| 82 | 1.875 | 0.625 | 0.225 | 0 | 3.166 | 97.2 | 148 |
| 83 | 10875 | 0.625 | 0.100 | 0 | 3.200 | 97.2 | 148 |
| 84 | 1.406 | 0.563 | 0.113 | 0 | 3.165 | 96.4 | 151 |
| 85 | 2.344 | 0.781 | 0.188 | 0.15 | 3.203 | 97.0 | 151 |
| 86 | 1.875 | 0.625 | 0.150 | 0.15 | 3.199 | 97.1 | 151 |
| 87 | 1.875 | 0.625 | 0.150 | 0.15 | 3.200 | 97.2 | 149 |
| 88 | 1.000 | 1.000 | 0.150 | 0.15 | 3.176 | 96.9 | 139 |
| 89 | 2.344 | 0.781 | 0.188 | 0.25 | 3.197 | 96.8 | 149 |
| 90 | 1.875 | 0.625 | 0.150 | 0.25 | 3.198 | 97.1 | 151 |
| 91 | 1.875 | 0.625 | 0.100 | 0.25 | 3.198 | 97.1 | 151 |
| 92 | 1.875 | 0.625 | 0.250 | 0.24 | 3.194 | 97.0 | 146 |

TABLE VII-continued

| Example No. | Y$_2$O$_3$ (g) | CaO (g) | AlB$_2$ (g) | Al$_2$O$_3$ (g) | Density (g/cm$^3$) | Density (% Theoretical) | Thermal Conductivity (W/m · K) |
|---|---|---|---|---|---|---|---|
| 93 | 2.344 | 0.781 | 0.188 | 0.40 | 3.191 | 96.6 | 150 |
| 94 | 1.875 | 0.625 | 0.150 | 0.40 | 3.205 | 97.3 | 145 |
| 95 | 1.875 | 0.625 | 0.100 | 0.40 | 3.207 | 97.3 | 148 |

The data in Table VII demonstrate that the sintering aid combination of Y$_2$O$_3$, CaO and AlB$_2$ tolerates higher levels of oxygen without significant adverse effects as measured by either density or thermal conductivity. Substantially higher levels of oxygen that accompany much higher levels of Al$_2$O$_3$ should lead to improvements in density at the expense of decreases in thermal conductivity.

EXAMPLES 96–97

Repeat Examples 41 and 56 as, respectively Examples 96 and 97, but sinter in the presence of a green body containing 2 wt % AlB$_2$. Table VIII shows comparative data for Examples 41, 56, 96 and 97.

TABLE VIII

| Example No. | Y$_2$O$_3$ (g) | CaO (g) | AlB$_2$ (g) | Density (g/cm$^3$) | Density (% Theoretical) | Thermal Conductivity (W/m · K) |
|---|---|---|---|---|---|---|
| 41* | 2 | 0.5 | 0 | 2.834 | 86.1 | 133 |
| 96 | 2 | 0.5 | 0 | 3.140 | 95.4 | 140 |
| 56* | 1.875 | 0.625 | 0 | 2.829 | 86.0 | — |
| 97 | 1.875 | 0.625 | 0 | 3.137 | 95.3 | 139 |

*means not an example of the invention
— means not measured

The data in Table VIII show that a volatile species such as boron enhances sintering of aluminum nitride compositions even when it is not part of the composition, so long as it is present, for example, in a crucible used to sinter the compositions.

EXAMPLES 98–102

Repeat Example 47, but vary the boron source to provide the data in Table IX. Examples 47 and 98–102 all contain 2 wt % Y$_2$O$_3$ and 0.5 wt % CaO. Although the weight percent of the various boron sources differs, each source is present in an equivalent molar percentage.

TABLE IX

| Example No. | Boron Source Type | g | Density (g/cm$^3$) | Density (% Theoretical) | Thermal Conductivity (W/m · K) |
|---|---|---|---|---|---|
| 47 | AlB$_2$ | 0.25 | 3.194 | 97.0 | 151 |
| 98 | YB$_6$ | 0.264 | 3.184 | 96.7 | 152 |
| 99 | SrB$_6$ | 0.260 | 3.203 | 97.3 | 149 |
| 100 | CaB$_6$ | 0.180 | 3.210 | 97.5 | 150 |
| 101 | AlB$_{12}$ | 0.134 | 3.193 | 97.0 | 150 |
| 102 | LaB$_6$ | 0.350 | 3.213 | 97.6 | 152 |

The data in Table IX show that a variety of boron sources provide satisfactory results in terms of density and thermal conductivity at 1625° C. in a graphite furnace.

EXAMPLES 103–108

Repeat Examples 47, 98–102, but change the sintering temperature to 1600° C. to provide the data in Table X.

TABLE X

| Example No. | Boron Source Type | g | Density (g/cm$^3$) | Density (% Theoretical) | Thermal Conductivity (W/m · K) |
|---|---|---|---|---|---|
| 103 | AlB$_2$ | 0.25 | 3.097 | 94.1 | 137 |
| 104 | YB$_6$ | 0.264 | 2.984 | 90.6 | 129 |
| 105 | SrB$_6$ | 0.260 | 3.105 | 94.3 | 136 |
| 106 | CaB$_6$ | 0.180 | 3.064 | 93.1 | 134 |
| 107 | AlB$_{12}$ | 0.134 | 3.115 | 94.6 | 136 |
| 108 | LaB$_6$ | 0.350 | 3.133 | 95.2 | 138 |

The data in Table X show the same trends as in Table IX. The data for Example 105, when compared to that of Examples 103, 104 and 106–108 simply show that some boron sources provide enhanced performance over other boron sources. Grinding YB$_6$ may provide better dispersion of the boron source and lead to improved results comparable to those of the other examples.

EXAMPLES 109–123

Repeat Example 39, but change the heating schedule to: heat to a temperature of 1400° C. at a rate of 10° C./minute, hold at 1400° C. for one hour, heat to 1850° C. at a rate of 2.5° C./minute, hold at 1850° C. for two hours, and then cool to 1000° C. at a rate of 10° C./minute. The formulations and resulting thermal conductivity are shown in Table XI.

TABLE XI

| Example No. | Y$_2$O$_3$ (g) | CaO (g) | AlB$_2$ (g) | Al$_2$O$_3$ (g) | Thermal Conductivity (W/m · K) |
|---|---|---|---|---|---|
| 109 | 3.0 | 0.0 | 0.0 | 0.0 | 186 |
| 110 | 2.34 | 0.78 | 0.18 | 0.0 | 181 |
| 111 | 2.81 | 0.94 | 0.23 | 0.0 | 177 |
| 112 | 2.34 | 0.78 | 0.19 | 0.25 | 179 |
| 113 | 1.88 | 0.63 | 0.15 | 0.25 | 181 |
| 114 | 1.88 | 0.63 | 0.10 | 0.25 | 181 |
| 115 | 1.88 | 0.63 | 0.25 | 0.25 | 179 |
| 116 | 1.88 | 0.63 | 0.15 | 0.15 | 183 |
| 117 | 1.88 | 0.63 | 0.15 | 0.40 | 182 |
| 118 | 2.34 | 0.78 | 0.19 | 0.40 | 178 |
| 119 | 1.88 | 0.63 | 0.10 | 0.15 | 177 |
| 120 | 1.88 | 0.63 | 0.10 | 0.40 | 181 |
| 121 | 1.41 | 0.56 | 0.11 | 0.0 | 182 |
| 122 | 1.00 | 1.00 | 0.15 | 0.15 | 185 |
| 123 | 1.75 | 0.75 | 0.25 | 0.0 | 184 |

*means not an example of the invention

The data in Table XI show that the three component sintering combination of Y$_2$O$_3$—CaO—AlB$_2$ (Examples 110, 111, 121 and 123) and four component sintering aid combination of Y$_2$O$_3$—CaO—AlB$_2$—Al$_2$O$_3$ (Examples 112–120 and 122), when used in sintering sinterable AlN compositions at temperatures as high as 1850° C., yield thermal conductivities that are statistically equivalent to that provided by a standard sinterable AlN composition using only 3 g Y$_2$O$_3$ at the same temperature (Example 109*). When sintered under equivalent conditions, authors writing in open literature would predict that addition of CaO, Al$_2$O$_3$ or both to Y$_2$O$_3$ would yield thermal conductivities below that provided by Y2O$_3$ as a sole sintering aid. The data in Table XI show that the presence of a small amount of a boron source as a sintering aid counters this prediction. Similar results are expected with other alkaline earth metal sources, rare earth metal sources, boron sources and aluminum oxide sources.

EXAMPLE 124

Prepare a milled slip using the procedure of Example 39 and 300 g AlN powder, 3.35 g $CaCO_3$ powder 5.62 g $Y_2O_3$ powder, 0.45 g $AlB_2$ powder, 93 g of toluene as the solvent, 33 g of a binder/dispersant ("ROHM AND HAAS, CO. ACRYLOID B-72") and 9 g of a plasticizer ("ARISTECH CHEMICAL COMPANY, PX-316"). The powders are the same as used in Example 39. The milled slip is converted to a cast green tape using conventional doctor blade techniques. The green tape is screen printed with a test ink pattern using a tungsten ink (CRYSTALERO, #2003 ink). Multilayer test pieces are fabricated by stacking and thermally laminating screen printed green tape pieces under an isostatic pressure of 2000 pounds per square inch (psi) (13.8 megapascals) at a temperature of 70° C. Binder burnout occurs in a flowing nitrogen atmosphere using a heating rate of 90° C./hour up to 750° C., holding at 750° C for four hours and cooling at a rate of 180° C./hour to room temperature (25° C.).

The multilayer test pieces are sintered in the tungsten furnace used in Examples 57–73 using the same sintering conditions as in Examples 57–73 to produce cofired (also known as cosintered) substrates. The cofired substrates have a density of 3.175 g/cm$^3$ (96.4% of theoretical) and a thermal conductivity of 134 W/m.K. Test circuit patterns resulting from the ink have an electrical resistance that varies from 13 to 26 milliohms/square.

EXAMPLE 125

Repeat Example 124, but reduce the amount of $AlB_2$ powder to 0.30 g. The cofired substrates have a density of 3.174 g/cm$^3$ and a thermal conductivity of 124 W/m.K. Test circuit patterns resulting from the ink have an electrical resistance that varies from 13.1 to 13.6 milliohms/square.

Examples 124 and 125 demonstrate the suitability of sinterable compositions of the invention for use in preparing multilayer, cofired substrate materials. The narrow variability of electrical resistance in Example 125 relative to Example 124 suggests that boron source levels should be kept relatively low. By way of illustration, when using $AlB_2$ as the boron source, the level should be at or below 0.15 wt %, based on sintered body weight, for more consistent results. Similar results are expected with other sinterable compositions and AlN powders, both of which are disclosed herein.

What is claimed is:

1. A sinterable aluminum nitride powder composition, for producing an aluminum nitride body having a thermal conductivity in the excess of 120 W/m.k comprising aluminum nitride powder and a sintering aid combination that consists essentially of a rare earth metal oxide source, an alkaline earth metal oxide source, a boron source selected from the group consisting of aluminum boride, aluminum diboride, calcium boride, yttrium boride, strontium boride, barium boride, cerium boride, praseodymium boride, samarium boride and neodymium boride, and optionally, a source of aluminum oxide, wherein the alkaline earth metal oxide source is in an amount sufficient to provide an equivalent alkaline earth metal oxide content within a range of from 0.2 to 5 percent by weight, the rare earth metal oxide source is present in an amount sufficient to provide an equivalent rare earth metal oxide content within a range of from 0.25 to 5 percent by weight, and the source of boron is present in an amount sufficient to provide an equivalent boron content within a range of from 0.01 to 1 percent by weight, all percentages being based upon sinterable composition weight.

2. A powder composition as claimed in claim 1, wherein the equivalent alkaline earth metal oxide content is within a range of from 0.5 to 5 percent by weight.

3. A powder composition as claimed in claim 1, wherein the sintering aid combination includes a source of alumina in an amount sufficient to provide an equivalent alumina content within a range of from greater than zero percent by weight to 2 percent by weight, based upon sinterable composition weight.

4. A powder composition as claimed in claim 3, wherein the sintering aid combination is present in an amount of from 0.5 to 10 percent by weight, based upon sinterable composition weight.

5. A powder composition as claimed in claim 4, wherein the rare earth metal oxide source is yttrium oxide, the alkaline earth metal oxide source is calcium carbonate and the boron source is aluminum diboride or aluminum boride.

6. A sintered aluminum nitride body having a thermal conductivity in excess of 120 W/m.k and comprising, based upon body weight, a) from 90 to 99.5 percent by weight aluminum nitride as a primary phase, b) from 0.5 to 10 percent by weight of a secondary phase selected from the group consisting of rare earth metal aluminates, alkaline earth metal-rare earth metal aluminates, and mixtures thereof, optionally with an alkaline earth metal aluminate, and c) boron in an amount of from 50 to 5000 parts by weight per million parts of body weight, as determined by secondary ion mass spectrometry.

7. A sintered aluminum nitride body as claimed in claim 4, wherein the rare earth metal is yttrium and the alkaline earth metal is calcium.

8. A sintered aluminum nitride body as claimed in claim 1 wherein the boron is present as a boron derivative that is dispersed on an atomic level within aluminum nitride's crystal lattice.

9. The sintered aluminum nitride body as claimed in any of claims 6–8, wherein the secondary phase is at least one of $Al_2Y_4O_9$, $AlYO_3$, $Al_5Y_3O_{12}$, $CaYAlO_4$ or $CaY_2O_4$.

10. The sintered aluminum nitride body as claimed in claim 9, wherein the body has a density of at least 95 percent of theoretical density.

11. The sintered aluminum nitride body as claimed in claim 10, wherein the thermal conductivity is from 120 to 230 W/m.K.

12. A process for preparing a sintered aluminum nitride body having a thermal conductivity in excess of 120 W/m.k that comprises heating a sinterable composition to a temperature of from 1570° C. to 1850° C. in a nonoxidizing atmosphere for a period of time sufficient to attain a density of at least 95 percent of theoretical density, the sinterable composition comprising aluminum nitride in an amount of from 90 to 99.5 percent by weight of composition and from 0.5 to 10 percent by weight of composition of a sintering aid combination that consists essentially of a rare earth metal oxide source, an alkaline earth metal oxide source and a boron source selected from the group consisting of aluminum boride, aluminum diboride, calcium boride, yttrium boride, strondium boride, barium boride, cerium boride, praseodymium boride, samarium boride and neodymium boride, and optionally, a source of aluminum oxide.

13. A process as claimed in claim 12, wherein the temperature is from 1570° C. to 1650° C.

14. A process as claimed in claims 12 or 13, wherein the sinterable composition comprises from 95 to 99.5 percent by weight of aluminum nitride and from 0.5 to 5 percent by weight of the sintering aid combination, both percentages being based upon sinterable composition weight and totaling 100 percent by weight.

15. A process as claimed in claim 14, wherein the alkaline earth metal oxide source is present in an amount sufficient to provide an equivalent alkaline earth metal oxide content within a range of from 0.2 to 5 percent by weight, the rare earth metal oxide source is present in an amount sufficient to provide an equivalent rare earth metal oxide content within a range of from 0.25 to 5 percent by weight, and the source of boron is present in an amount sufficient to provide an equivalent boron content within a range of from 0.01 to 1 percent by weight, all percentages being based upon sinterable composition weight.

16. A process as claimed in claim 15, wherein the sintering aid combination includes a source of aluminum oxide in an amount sufficient to provide an equivalent aluminum oxide content within a range of from greater than zero percent by weight to 2 percent by weight, based upon sinterable composition weight.

17. The process of claim 12, wherein the sintered body has a thermal conductivity of from 120 to 230 W/m.K.

18. A method of preparing a cofired, multilayer aluminum nitride substrate, the method comprising:

a. preparing at least two ceramic green sheets from the sinterable composition of claim 1;

b. depositing a pattern of a refractory metal ink on at least one major planar surface of at least one ceramic green sheet;

c. preparing a laminate of ceramic green sheets having refractory metal ink deposited thereon;

d. heating the laminate in a non-oxidizing atmosphere, at atmospheric pressure and at a temperature of from 1570° to 1850° C. to effect sintering of both the ceramic sheets and the refractory metal ink deposited on said sheets.

* * * * *

UNITED STATES PATENT AND TRADEMARK OFFICE
CERTIFICATE OF CORRECTION

PATENT NO. : 5,744,411
DATED : April 28, 1998
INVENTOR(S) : JunHong Zhao et al.

It is certified that error appears in the above-identified patent and that said Letters Patent is hereby corrected as shown below:

Claim 7, column 18, line 30, "4" should correctly read --6--.

Signed and Sealed this

Sixteenth Day of February, 1999

Attest:

Attesting Officer

*Acting Commissioner of Patents and Trademarks*